US008098833B2

(12) United States Patent
Zumsteg et al.

(10) Patent No.: US 8,098,833 B2

(45) Date of Patent: *Jan. 17, 2012

(54) SYSTEM AND METHOD FOR DYNAMIC MODIFICATION OF SPEECH INTELLIGIBILITY SCORING

(75) Inventors: Philip J. Zumsteg, Shorewood, MN (US); D. Michael Shields, St. Paul, MN (US)

(73) Assignee: Honeywell International Inc., Morristown, NJ (US)

(*) Notice: Subject to any disclaimer, the term of this patent is extended or adjusted under 35 U.S.C. 154(b) by 994 days.

This patent is subject to a terminal disclaimer.

(21) Appl. No.: 11/668,221

(22) Filed: Jan. 29, 2007

(65) Prior Publication Data

US 2007/0192098 A1 Aug. 16, 2007

Related U.S. Application Data

(63) Continuation-in-part of application No. 11/319,917, filed on Dec. 28, 2005.

(51) Int. Cl.

| | |
|---|---|
| ***H03G 3/20*** | (2006.01) |
| ***H04R 29/00*** | (2006.01) |
| ***H04B 15/00*** | (2006.01) |
| ***G10L 15/20*** | (2006.01) |
| ***G10L 21/00*** | (2006.01) |
| ***H04R 3/00*** | (2006.01) |

(52) U.S. Cl. ............. 381/57; 381/56; 381/94.1; 381/83; 381/93; 381/94.8; 381/111; 381/122; 704/233; 704/E19.002; 704/270; 704/270.1

(58) Field of Classification Search .................... 381/57, 381/94.1, 83, 113, 55, 59, 56, 93, 94.7, 94.8, 381/111, 122; 704/233, E19.002, 270, 270.1; 703/2

See application file for complete search history.

(56) References Cited

U.S. PATENT DOCUMENTS

| | | | | |
|---|---|---|---|---|
| 4,442,323 A | 4/1984 | Yoshida et al. | | 179/110 A |
| 4,771,472 A | 9/1988 | Williams, III et al. | | 381/94 |
| 5,119,428 A | 6/1992 | Prinssen | | 381/83 |
| 5,699,479 A | 12/1997 | Allen et al. | | 395/2.14 |
| 5,729,694 A * | 3/1998 | Holzrichter et al. | | 705/17 |
| 5,933,808 A | 8/1999 | Kang et al. | | 704/278 |
| 6,542,857 B1 * | 4/2003 | Holzrichter et al. | | 703/2 |
| 6,993,480 B1 | 1/2006 | Klayman | | 704/226 |
| 2005/0135637 A1 | 6/2005 | Obranovich et al. | | |
| 2005/0216263 A1 | 9/2005 | Obranovich et al. | | 704/233 |

(Continued)

FOREIGN PATENT DOCUMENTS

GB 2 336 978 A 11/1999

(Continued)

OTHER PUBLICATIONS

International Search Report and Written Opinion of the International Searching Authority, mailed Feb. 25, 2008 corresponding to International Application No. PCT/US06/48794.

(Continued)

*Primary Examiner* — Devona Faulk

(74) *Attorney, Agent, or Firm* — Husch Blackwell

(57) ABSTRACT

A system and method to detect and measure remediated speech intelligibility by evaluating received test audio transmitted across and received in a space or region of interest. Remediation of the test audio may include altering the rate, pitch, amplitude and frequency bands energy during presentation of the speech signal.

25 Claims, 8 Drawing Sheets

U.S. PATENT DOCUMENTS

2006/0126865 A1 6/2006 Blamey et al.

FOREIGN PATENT DOCUMENTS

| | | | |
|---|---|---|---|
| WO | WO 97/03424 | | 1/1997 |
| WO | WO 2005/069685 | A1 | 7/2005 |

OTHER PUBLICATIONS

David Griesinger, Recent Experiences with Electronic Acoustic Enhancement in Concert Halls and Opera Houses, available at http://www.world.std.com/-griesnger/icsv.html, published before Apr. 16, 2004.

International Search Report and Written Opinion of the International Searching Authority, mailed Jul. 11, 2008 corresponding to International Application No. PCT/US 08/51100.

Supplementary European Search Report, dated Dec. 9, 2009 corresponding to European Application No. 08713774.1.

European Search Report EP 08 71 3774 dated Dec. 15, 2009 (4 pages).

* cited by examiner

SYSTEM AND METHOD FOR DYNAMIC MODIFICATION OF SPEECH INTELLIGIBILITY SCORING

CROSS-REFERENCE TO RELATED APPLICATION

This application is a Continuation-In-Part of application Ser. No. 11/319,917 entitled: "System and Method of Detecting Speech Intelligibility of Audio Announcement Systems In Noisy and Reverberant Spaces", filed Dec. 28, 2005.

FIELD OF THE INVENTION

The invention pertains to systems and methods of evaluating the quality of audio output provided by a system for individuals in region. More particularly, within a specific region the intelligibility of provided audio is evaluated after remediation is applied to the original audio signal.

BACKGROUND OF THE INVENTION

It has been recognized that speech or audio being projected or transmitted into a region by an audio announcement system is not necessarily intelligible merely because it is audible. In many instances, such as sports stadiums, airports, buildings and the like, speech delivered into a region may be loud enough to be heard but it may be unintelligible. Such considerations apply to audio announcement systems in general as well as those which are associated with fire safety, building or regional monitoring systems.

The need to output speech messages into regions being monitored in accordance with performance-based intelligibility measurements has been set forth in one standard, namely, NFPA 72-2002. It has been recognized that while regions of interest, such as conference rooms or office areas may provide very acceptable acoustics, some spaces such as those noted above, exhibit acoustical characteristics which degrade the intelligibility of speech.

It has also been recognized that regions being monitored may include spaces in one or more floors of a building, or buildings exhibiting dynamic acoustic characteristics. Building spaces are subject to change over time as occupancy levels vary, surface treatments and finishes are changed, offices are rearranged, conference rooms are provided, auditoriums are incorporated and the like.

One approach for monitoring speech intelligibility due to such changing acoustic characteristics in monitored regions has been disclosed and claimed in U.S. patent application Ser. No. 10/740,200 filed Dec. 18, 2003, entitled "Intelligibility Measurement of Audio Announcement Systems" and assigned to the assignee hereof. The '200 application is incorporated herein by reference.

One approach for improving the intelligibility of speech messages in response to changes in such acoustic characteristics in monitored region has been disclosed and claimed in U.S. patent application Ser. No. 11/319,917 filed Dec. 28, 2005, entitled "System and Method of Detecting Speech Intelligibility and of Improving Intelligibility of Audio Announcement Systems in Noisy and Reverberant Spaces" and assigned to the assignee hereof. The '917 application is incorporated herein by reference.

There is a continuing need to measure speech intelligibility in accordance with NFPA 72-2002 after remediation of the speech messages has been undertaken in one or more monitored regions.

Thus, there continues to be an ongoing need for improved, more efficient methods and systems of measuring speech intelligibility in regions of interest following the remediation of speech messages so as to improve such intelligibility. It would also be desirable to be able to incorporate some or all of such remediation capability in a way that takes advantage of ambient condition detectors in a monitoring system which are intended to be distributed throughout a region being monitored. Preferably, the measurement of speech intelligibility of speech messages with remediation could be incorporated into the detectors being currently installed, and also be cost effectively incorporated as upgrades to detectors in existing systems as well as other types of modules.

DETAILED DESCRIPTION OF THE EMBODIMENTS

Figure 1:
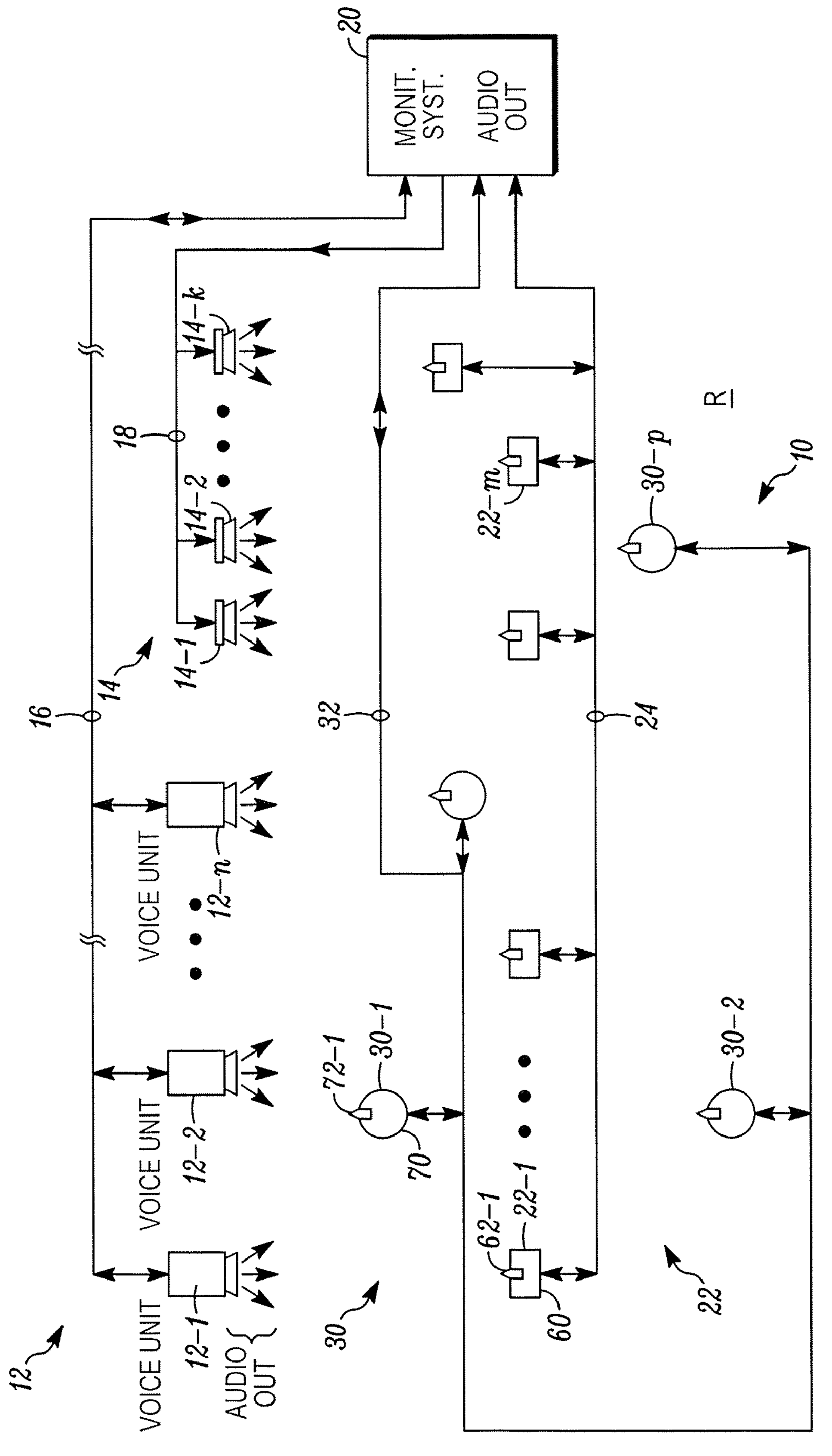
FIG. 1 is a block diagram of a system in accordance with the invention.

While embodiments of this invention can take many different forms, specific embodiments thereof are shown in the drawings and will be described herein in detail with the understanding that the present disclosure is to be considered as an exemplification of the principles of the invention and is not intended to limit the invention to the specific embodiment illustrated.

Systems and methods in accordance with the invention, sense and evaluate audio outputs overlaid on ambient sound in a region from one or more transducers, such as loudspeakers, to measure the intelligibility of selected audio output signals in a building space or region being monitored. Changes in the speech intelligibility of audio output signals may be measured after applying remediation to the source signal, as taught in the '917 application. The results of the analysis can be used to determine the degree to which the intelligibility of speech messages projected into the region are affected by the selected remediation to such speech messages.

In one aspect of the invention one or more acoustic sensors located throughout a region sense and quantify the speech intelligibility of incoming predetermined audible test signals for a predetermined period of time. For example, the test signals can be periodically injected into the region for a specified time interval. Such test signals may be constructed according to quantitative speech intelligibility measurement methods, including, but not limited to RASTI, STI, and the like, as described in IEC 60268-16. For the selected measurement method, the described test signal is remediated according to the process described in the '917 application before presentation into the monitored region.

In another aspect of the invention, the specific remediation present in the test signal is communicated to one or more acoustic sensors located throughout the monitored region. Each sensor uses the remediation information to determine adjustments to the selected quantitative speech intelligibility method. Results of the determination and adjusted speech intelligibility results can be made available for system operators and can be used in manual and/or automatic methods of remediation.

Systems and methods in accordance with the invention provide an adaptive approach to monitoring the speech intelligibility characteristics of a space or region over time, and especially during times when acceptable speech message intelligibility is essential for safety. The performance of respective amplifier, output transducer and remediation combination(s) can then be evaluated to determine if the desired level of speech intelligibility is being provided in the respective space or region, even as the acoustic characteristics of such a space or region is varying.

Further, the present systems and methods seek to dynamically determine the speech intelligibility of remediated acoustic signals in a monitored space which are relevant to providing emergency speech announcement messages, in order to satisfy performance-based standards for speech intelligibility. Such monitoring will also provide feedback as to those spaces with acoustic properties that are marginal and may not comply with such standards even with acoustic remediation of the speech message.

FIG. 1 illustrates a system 10 which embodies the present invention. At least portions of the system 10 are located within a region R where speech intelligibility is to be evaluated. It will be understood that the region R could be a portion of or the entirety of a floor, or multiple floors, of a building. The type of building and/or size of the region or space R are not limitations of the present invention.

The system 10 can incorporate a plurality of voice output units 12-1, 12-2 . . . 12-*n* and 14-1, 14-2 . . . 14-*k*. Neither the number of voice units 12-*n* and 14-*k* nor their location within the region R are limitations of the present invention.

The voice units 12-1, 12-2 . . . 12-*n* can be in bidirectional communication via a wired or wireless medium 16 with a displaced control unit 20 for an audio output and a monitoring system. It will be understood that the unit 20 could be part of or incorporate a regional control and monitoring system which might include a speech annunciation system, fire detection system, a security system, and/or a building control system, all without limitation. It will be understood that the exact details of the unit 20 are not limitations of the present invention. It will also be understood that the voice output units 12-1, 12-2 . . . 12-*n* could be part of a speech annunciation system coupled to a fire detection system of a type noted above, which might be part of the monitoring system 20.

Additional audio output units can include loud speakers 14-*i* coupled via cable 18 to unit 20. Loud speakers 14-*i* can also be used as a public address system.

System 10 also can incorporate a plurality of audio sensing modules having members 22-1, 22-2 . . . 22-*m*. The audio sensing modules or units 22-1 . . . -m can also be in bidirectional communication via a wired or wireless medium 24 with the unit 20.

As described above and in more detail subsequently, the audio sensing modules 22-*i* respond to incoming audio from one or more of the voice output units, such as the units 12-*i*, 14-*i* and carry out, at least in part, processing thereof. Further, the units 22-*i* communicate with unit 20 for the purpose of obtaining the remediation information for the region monitored by the units 22-*i*. Those of skill will understand that the below described processing could be completely carried out in some or all of the modules 22-*i*. Alternately, the modules 22-*i* can carry out an initial portion of the processing and forward information, via medium 24 to the system 20 for further processing.

The system 10 can also incorporate a plurality of ambient condition detectors 30. The members of the plurality 30, such as 30-1, -2 . . . -p could be in bidirectional communication via a wired or wireless medium 32 with the unit 20. The units 30-*i* communicate with unit 20 for the purpose of obtaining the remediation information for the region monitored by the units 30-*i*. It will be understood that the members of the plurality 22 and the members of the plurality 30 could communicate on a common medium all without limitation.

Figure 2A:
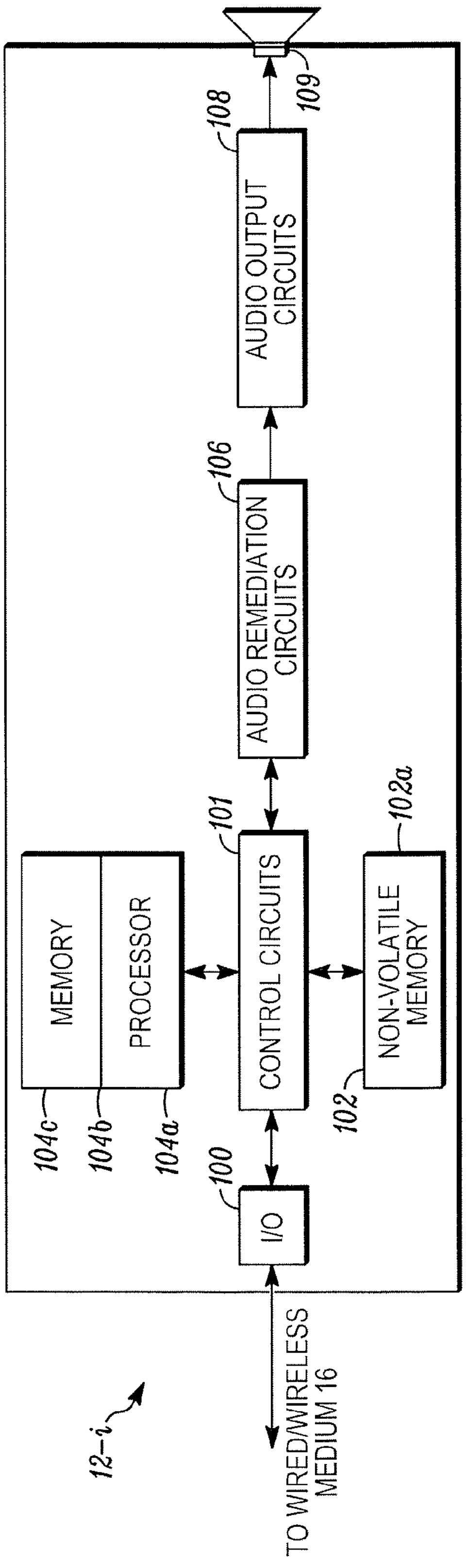
FIG. 2A is a block diagram of an audio output unit in accordance with the invention.

FIG. 2A is a block diagram of a one embodiment of representative member 12-*i* of the plurality of voice output units 12. The unit 12-*i* incorporates input/output (I/O) interface circuitry 100 which is coupled to the wired or wireless medium 16 for bidirectional communications with monitoring unit 20. Such communications may include, but is not limited to, audio output signals and remediation information.

The unit 12-*i* also incorporates control circuitry 101, a programmable processor 104*a* and associated control software 104*b* as well as a read/write memory 104*c*. The desired audio remediation may be performed in whole or part by the combination of, the software 104*b* executed by the processor 104*a* using memory 104*c*, and the audio remediation circuits 106. The desired remediation information to alter the audio output signal is provided by unit 20. The remediated audio messages or communications to be injected into the region R are coupled via audio output circuits 108 to an audio output transducer 109. The audio output transducer 109 can be any one of a variety of loudspeakers or the like, all without limitation.

Figure 2B:
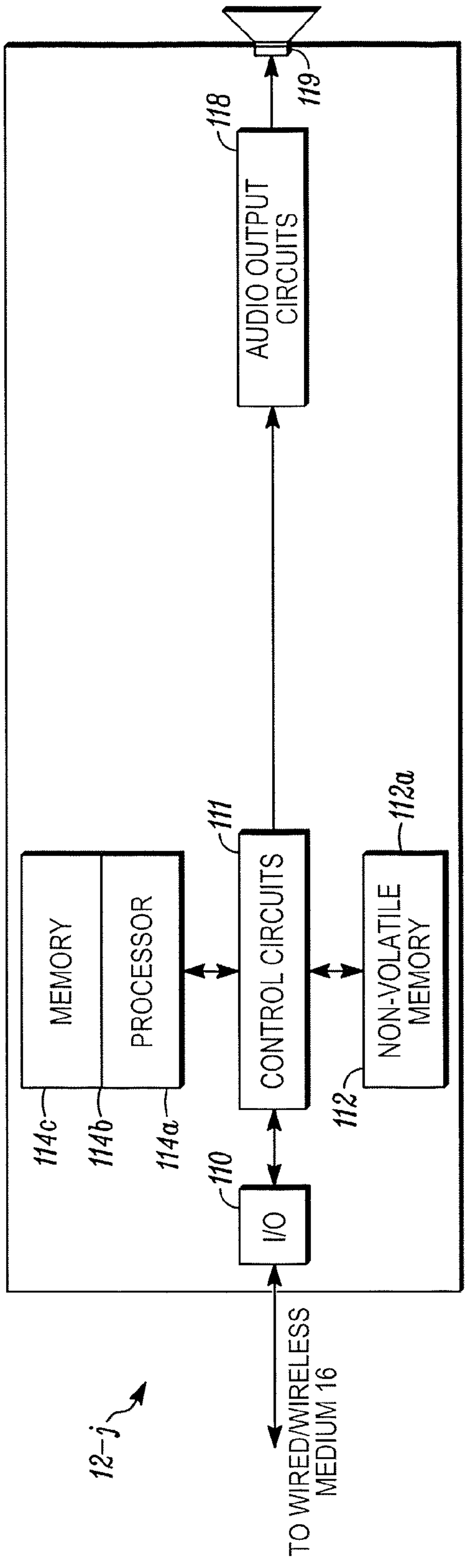
FIG. 2B is an alternate audio output unit.

FIG. 2B is a block diagram of another embodiment of representative member 12-*j* of the plurality of voice output units 12. The unit 12-*j* incorporates input/output (I/O) interface circuitry 110 which is coupled to the wired or wireless medium 16 for bidirectional communications with monitoring unit 20. Such communications may include, but is not limited to, remediated audio output signals and remediation information.

The unit 12-*j* also incorporates control circuitry 111, a programmable processor 114*a* and associated control software 114*b* as well as a read/write memory 114*c*.

Figure 2C:
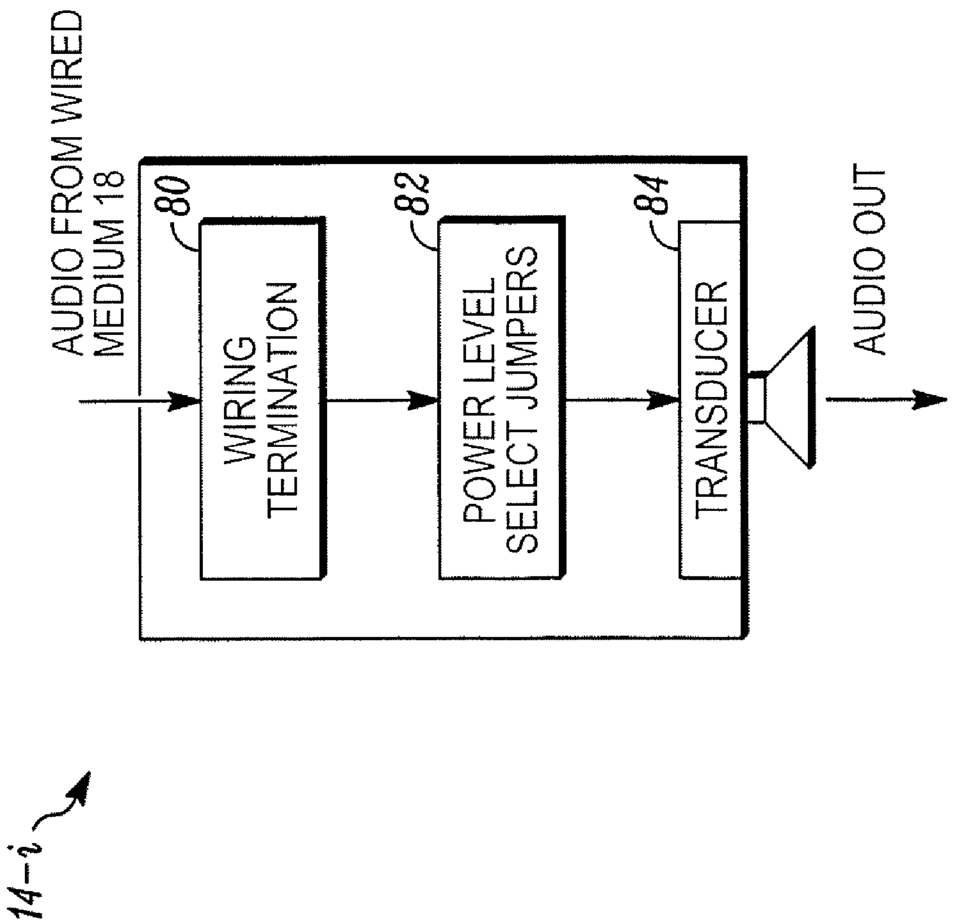
FIG. 2C is another alternate audio output unit.

Processed audio signals are coupled via audio output circuits 118 to an audio output transducer 119. The audio output transducer 119 can be any one of a variety of loudspeakers or the like, all without limitation. FIG. 2C illustrates details of a representative member 14-*i* of the plurality 14. A member 14-*i* can include wiring termination element 80, power level select jumpers 82 and audio output transducer 84. Remediated audio is provided by unit 20 via wired medium 18.

Figure 3:
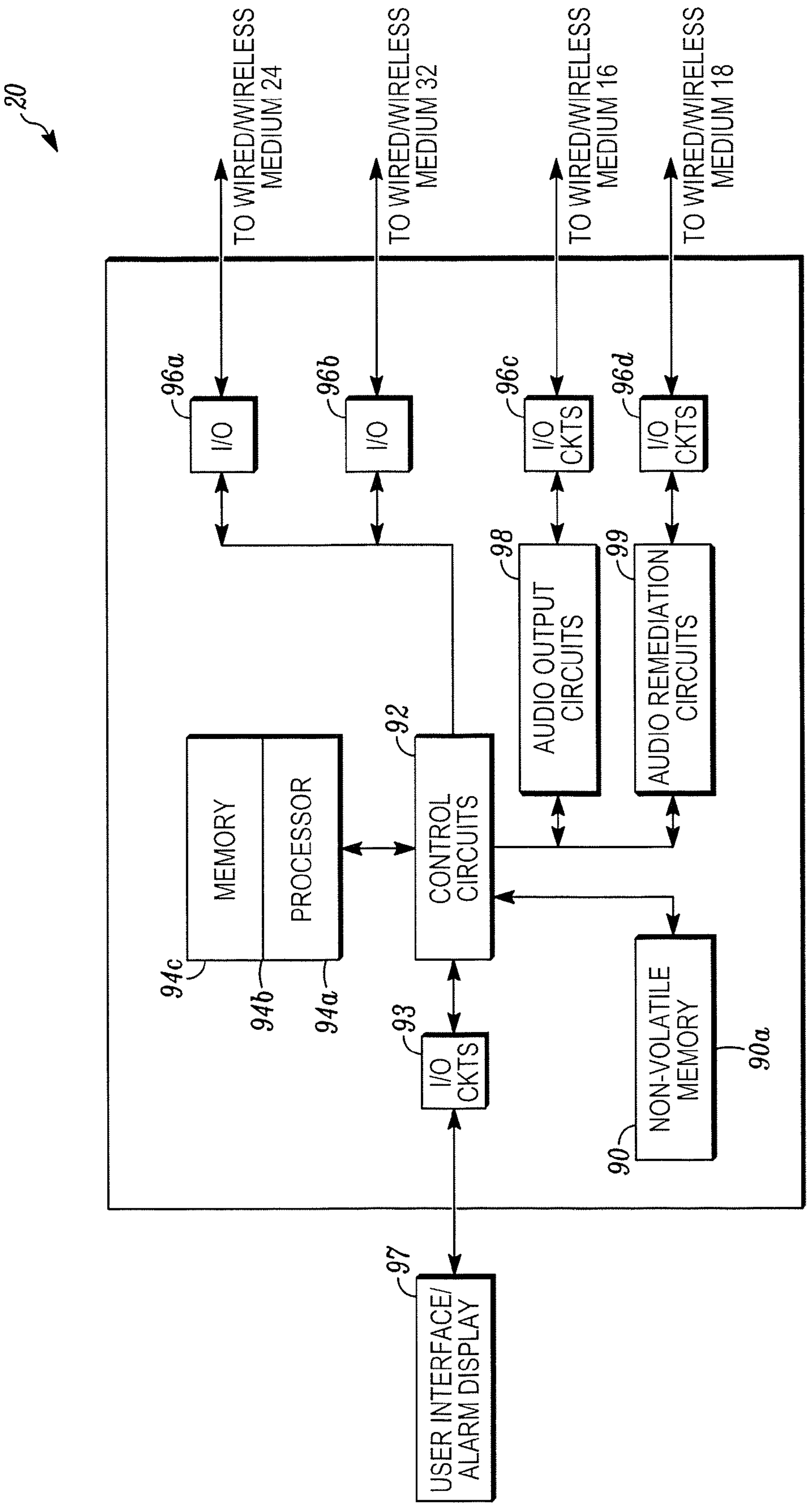
FIG. 3 is a block diagram of an exemplary common control unit usable in the system of FIG. 1.

FIG. 3 is an exemplary block diagram of unit 20. The unit 20 can incorporate input/output circuitry 93 and 96*a*, 96*b*, 96*c* and 96*d* for communicating with respective wired/wireless media 24, 32, 16 and 18. The unit 20 can also incorporate control circuitry 92 which can be in communication with a nonvolatile memory unit 90, a programmable processor 94*a*, an associated storage unit 94*c* as well as control software 94*b*. It will be understood that the illustrated configuration of the unit 20 in FIG. 3 is an exemplary only and is not a limitation of the present invention.

Figure 4A:
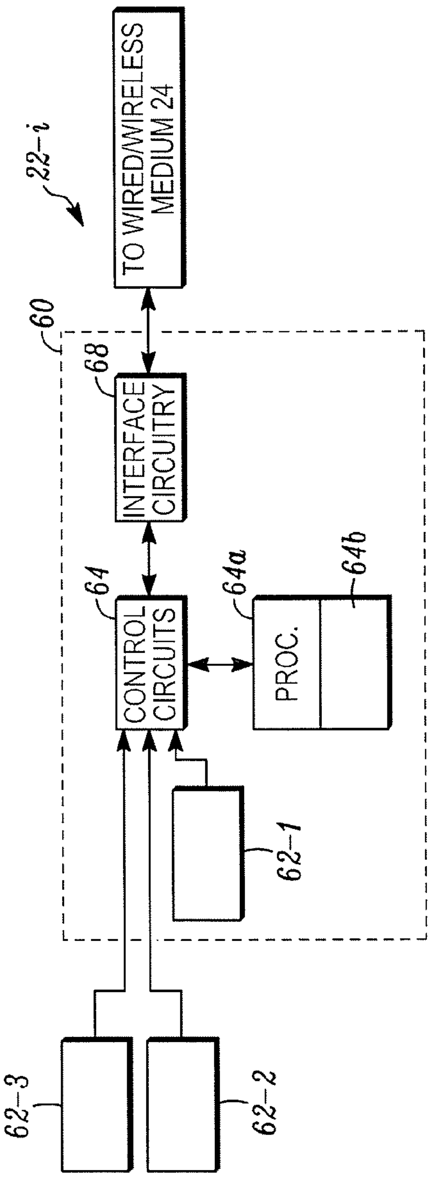
FIG. 4A is a block diagram of a detector of a type usable in the system of FIG. 1.

FIG. 4A is a block diagram of a representative member 22-*i* of the plurality of audio sensing modules 22. Each of the members of the plurality, such as 22-*i*, includes a housing 60 which carries at least one audio input transducer 62-1 which could be implemented as a microphone. Additional, outboard, audio input transducers 62-2 and 62-3 could be coupled along with the transducer 62-1 to control circuitry 64. The control circuitry 64 could include a programmable processor 64*a* and associated control software 64*b*, as discussed below, to implement audio data acquisition processes as well as evaluation and analysis processes to determine results of the selected quantitative speech intelligibility method, adjusted for remediation, relative to audio or voice message signals being received at one or more of the transducers 62-*i*. The module 22-*i* is in bidirectional communications with interface circuitry 68 which in turn communicates via the wired or wireless medium 24 with system 20. Such communications may include, but is not limited to, selecting a speech intelligibility method and remediation information.

Figure 4B:
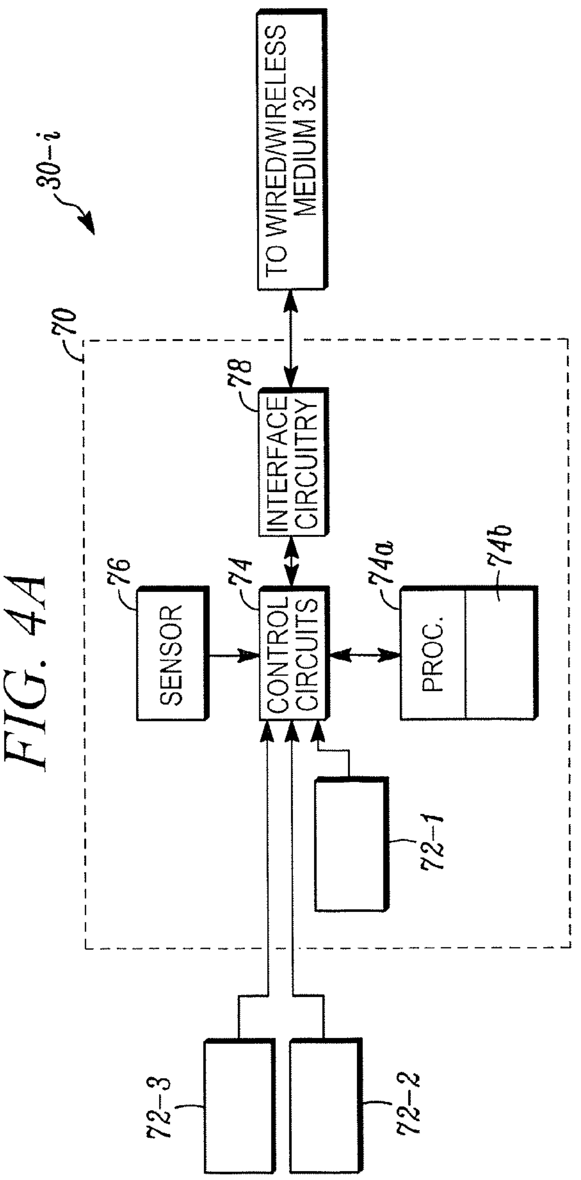
FIG. 4B is a block diagram of a sensing and processing module usable in the system of FIG. 1.

FIG. 4B is a block diagram of a representative member 30-*i* of the plurality 30. The member 30-*i* has a housing 70 which can carry an onboard audio input transducer 72-1 which could be implemented as a microphone. Additional audio input transducers 72-2 and 72-3 displaced from the housing 70 can be coupled, along with transducer 72-1 to control circuitry 74.

Control circuitry 74 could be implemented with and include a programmable processor 74*a* and associated control software 74*b*. The detector 30-*i* also incorporates an ambient condition sensor 76 which could sense smoke, flame, temperature, gas all without limitation. The detector 30-*i* is in bidirectional communication with interface circuitry 78 which in turn communicates via wired or wireless medium 32 with monitoring system 20. Such communications may include, but is not limited to, selecting a speech intelligibility method and remediation information.

As discussed subsequently, processor 74*a* in combination with associated control software 74*b* can not only process signals from sensor 76 relative to the respective ambient condition but also process audio related signals from one or more transducers 72-1, -2 or -3 all without limitation. Processing, as described subsequently, can carry out evaluation and a determination as to the nature and quality of audio being received and results of the selected quantitative speech intelligibility method, adjusted for remediation.

Figure 5A:
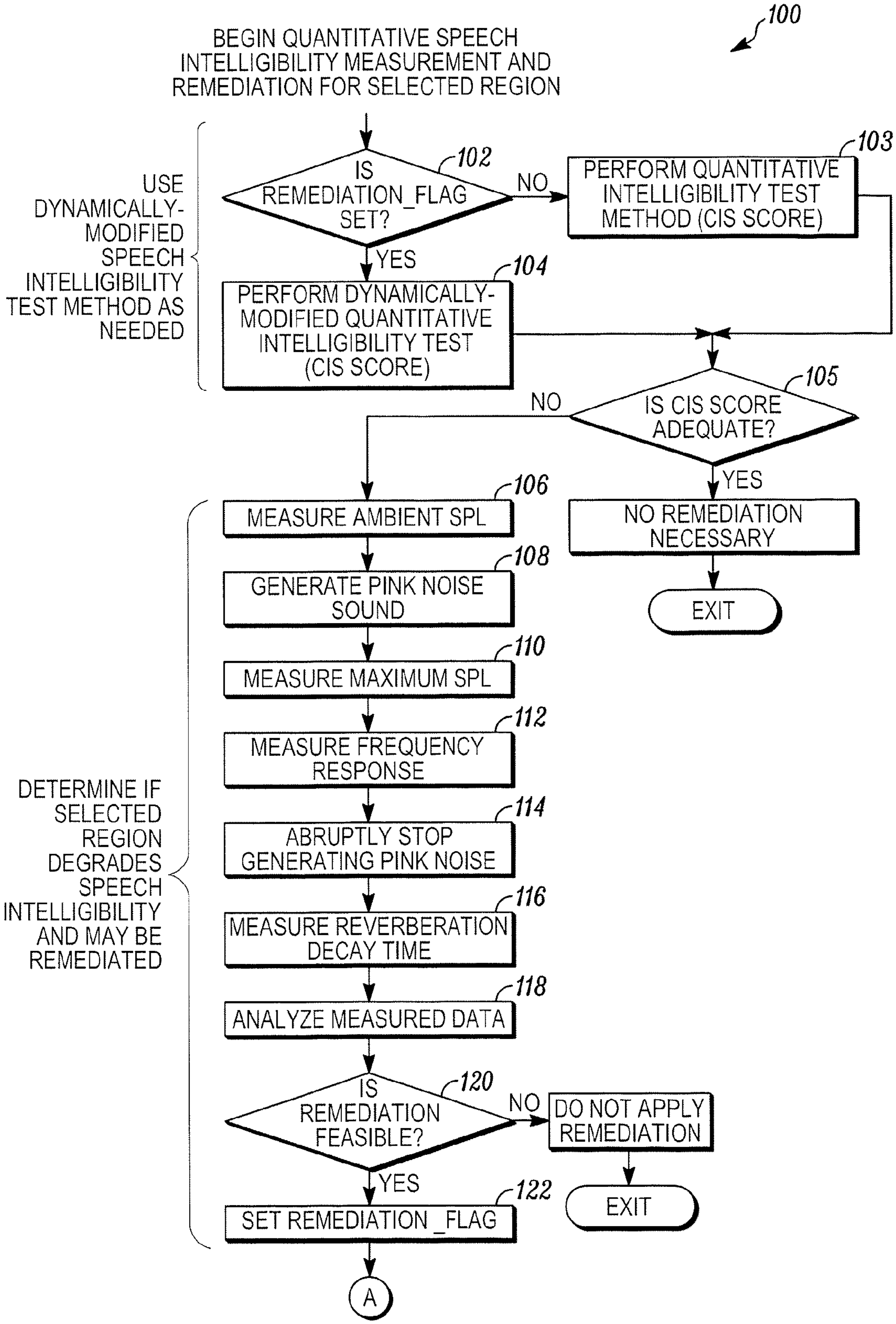
FIGS. 5A, 5B taken together are a flow diagram of a method of remediation.

FIG. 5A, a flow diagram, illustrates steps of an evaluation process 100 in accordance with the invention. The process 100 can be carried out wholly or in part at one or more of the modules 22-*i* or detectors 30-*i* in response to received audio. It can also be carried out wholly or in part at unit 20.

Figure 5B:
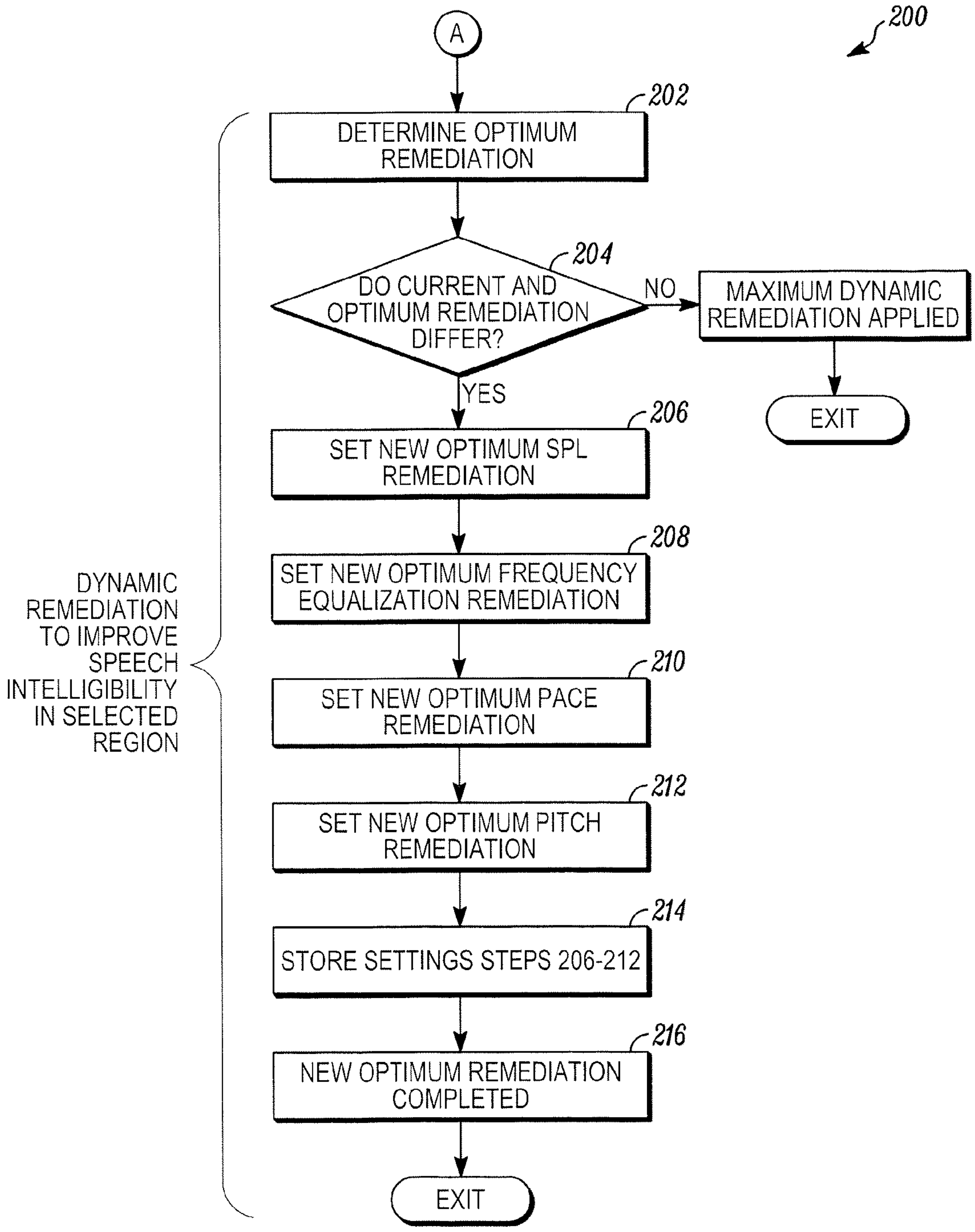

FIG. 5B, illustrates steps of a remediation process 200 also in accordance with the invention. The process 200 can be carried out wholly or in part at one or more of the modules 22-*i* or detectors 30-*i* or modules 12-1 in response to processing commands and audio signals from unit 20. It can also be carried out wholly or in part at unit 20. The methods 100, 200 can be performed sequentially or independently without departing from the spirit and scope of the invention.

In step 102, the selected region is checked for previously applied audio remediation. If no remediation is being applied to audio presented by the system in the selected region, then a conventional method for quantitatively measuring the Common Intelligibility Scale (CIS) of the region may be performed, as would be understood by those of skill in the art. If remediation has been applied to the audio signals presented into the selected region, then a dynamically-modified method for measuring CIS is utilized in step 104. The remediation is applied to all audio signals presented by the system into the selected region, including speech announcements, test audio signals, modulated noise signals and the like, all without limitation. The dynamically-modified method for measuring CIS adjusts the criteria used to evaluate intelligibility of a test audio signal to compensate for the currently applied remediation.

For either CIS method, a predetermined sound sequence, as would be understood by those of skill in the art, can be generated by one or more of the voice output units 12-1, -2 . . . -n and/or 14-1, -2 . . . -k or system 20, all without limitation. Incident sound can be sensed for example, by a respective member of the plurality 22, such as module 22-*i* or member of the plurality 30, such as module 30-*i*. For either CIS method, if the measured CIS value indicates the selected region does not degrade speech messages, then no further remediation is necessary.

Those of skill will understand that the respective modules or detectors 22-*i*, 30-*i* sense incoming audio from the selected region, and such audio signals may result from either the ambient audio Sound Pressure Level (SPL) as in step 106, without any audio output from voice output units 12-1, -2, . . . , n and/or 14-1, -2, . . . -k, or an audio signal from one or more voice output units such as the units 12-*i*,14-*i*, as in step 108. Sensed ambient SPL can be stored. Sensed audio is determined, at least in part, by the geographic arrangement, in the space or region R, of the modules and detectors 22-*i*, 30-*i* relative to the respective voice output units 12-*i*, 14-*i*. The intelligibility of this incoming audio is affected, and possibly degraded, by the acoustics in the space or region which extends at least between a respective voice output unit, such as 12-*i*, 14-*i* and the respective audio receiving module or detector such as 22-*i*, 30-*i*.

The respective sensor, such as 62-1 or 72-1, couples the incoming audio to processors such as processor 64*a* or 74*a* where data, representative of the received audio, are analyzed. For example, the received sound from the selected region in response to a predetermined sound sequence, such as step 108, can be analyzed for the maximum SPL resulting from the voice output units, such as 12-*i*, 14-*i*, and analyzed for the presence of energy peaks in the frequency domain in step 112. Sensed maximum SPL and peak frequency domain energy data of the incoming audio can be stored.

The respective processor or processors can analyze the sensed sound for the presence of predetermined acoustical noise generated in step 108. For example, and without limitation, the incoming predetermined noise can be 100 percent amplitude modulated noise of a predetermined character having a predefined length and periodicity. In steps 114 and 116 the respective space or region decay time can then be determined.

The noise and reverberant characteristics can be determined based on characteristics of the respective amplifier and output transducer, such as 108, 109 and 118 and 119 and 84 of the representative voice output unit 12-*i*, 14-*i*, relative to maximum attainable sound pressure level and frequency bands energy. A determination, in step 120, can then be made as to whether the intelligibility of the speech has been degraded but is still acceptable, unacceptable but able to be compensated, or unacceptable and unable to be compensated. The evaluation results can be communicated to monitoring system 20.

In accordance with the above, and as illustrated in FIG. 5A, the state of a remediation flag is checked in step 102. If set, the intelligibility test score can be determined for one or more of the members of the plurality 22, 30 in accordance with the processing of FIG. 6 hereof.

In step 106, the ambient sound pressure level associated with a measurement output from a selected one or more of the modules or detectors 22, 30 can be measured. Audio noise can be generated, for example one hundred percent amplitude modulated noise, from at least one of the voice output units 12-*i* or speakers 14-*i*. In step 110 the maximum sound pressure level can be measured, relative to one or more selected sources. In step 112 the frequency domain characteristics of the incoming noise can be measured.

In step 114 the noise signal is abruptly terminated. In step 116 the reverberation decay time of the previously abruptly terminated noise is measured. The noise and reverberant characteristics can be analyzed in step 118 as would be understood by those of skill in the art. A determination can be made in step 120 as to whether remediation is feasible. If not, the process can be terminated. In the event that remediation is feasible, a remediation flag can be set, step 122 and the remediation process 200, see FIG. 3B, can be carried out. It will be understood that the process 100 can be carried out by some or all of the members of the plurality 22 as well as some or all of the members of the plurality 30. Additionally, a portion of the processing as desired can be carried out in monitoring unit 20 all without limitation. The method 100 provides an adaptive approach for monitoring characteristics of the space over a period of time so as to be able to determine that the coverage provided by the voice output units such as the unit 12-*i*, 14-*i*, taking the characteristics of the space into account, provide intelligible speech to individuals in the region R.

FIG. 5B is a flow diagram of processing 200 which relates to carrying out remediation where feasible.

In step 202, an optimum remediation is determined. If the current and optimum remediation differ as determined in step 204, then remediation can be carried out. In step 206 the determined optimum SPL remediation is set. In step 208 the determined optimum frequency equalization remediation can then be carried out. In step 210 the determined optimum pace remediation can also be set. In step 212 the determined optimum pitch remediation can also be set. The determined optimum remediation settings can be stored in step 214. The process 200 can then be concluded step 216.

It will be understood that the processing of method 200 can be carried out at some or all of the modules 12, detectors 30 and output units 12 in response to incoming audio from system 20 or other audio input source without departing from the spirit or scope of the present invention. Further, that processing can also be carried out in alternate embodiments at monitoring unit 20.

Those of skill will understand that the commands or information to shape the output audio signals could be coupled to the respective voice output units such as the unit 12-*i*, or unit 20 may shape an audio output signal to voice output units such as 14-*i*. Those units would in turn provide the shaped speech signals to the respective amplifier and output transducer combination 108 and 109, 118 and 119, and 84.

As will also be understood by those skilled in the art, remediation is possible within a selected region when the settable values which affect the intelligibility of speech announcements from voice output units 12-*i* or speakers 14-*i*, can be set to values to cause improved intelligibility of speech announcements.

Figure 6:
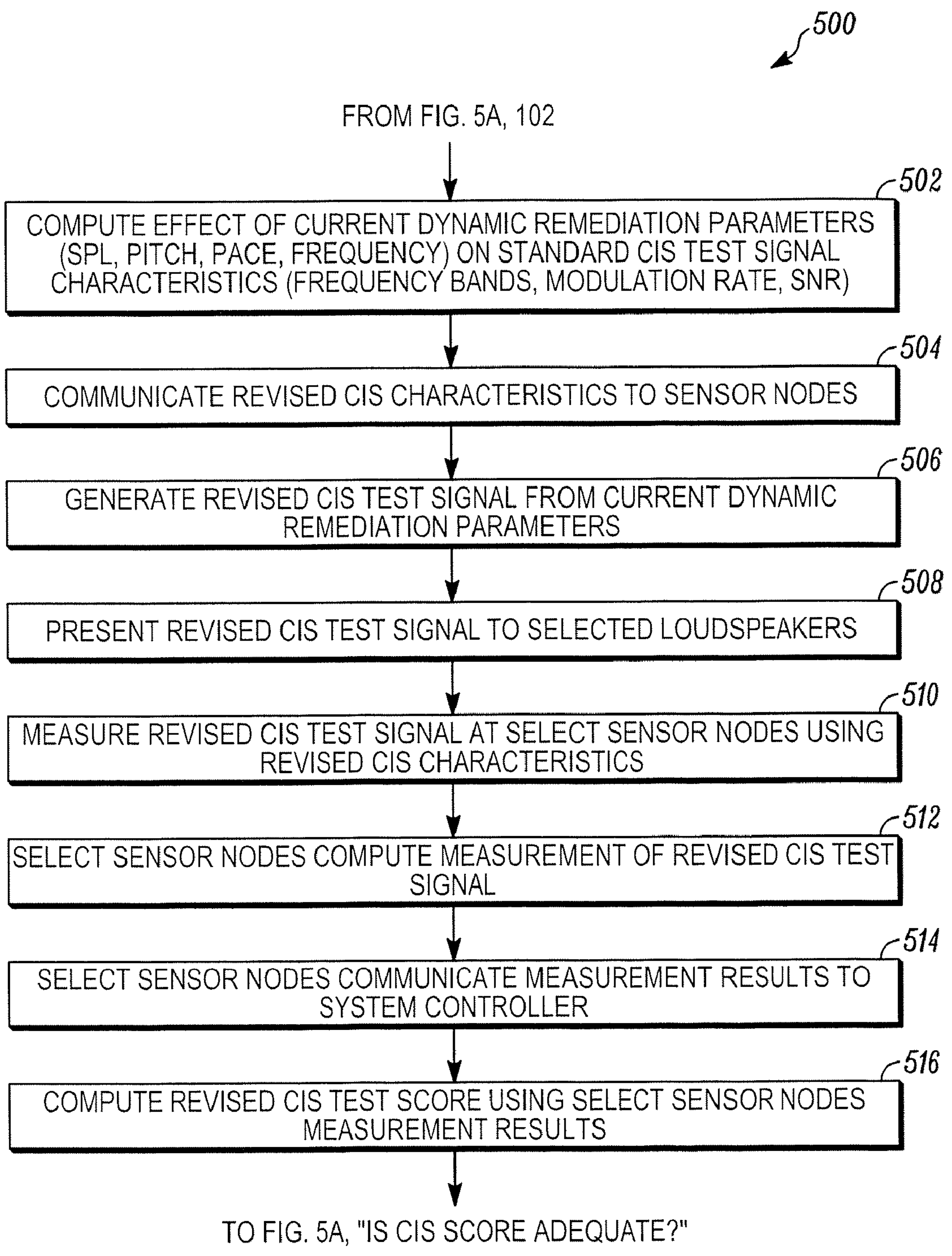
FIG. 6 is a flow diagram of additional details of the method of FIGS. 5A, B in accordance with the invention.

FIG. 6, a flow diagram, illustrates details of an evaluation process 500 for carrying out 104, FIG. 5A, in accordance with the invention. The process 500 can be carried out wholly or in part at one or more of the modules 22-*i* or detectors 30-*i* in response to received audio and remediation information communicated by unit 20. The process 500 can also be carried out wholly or in part at unit 20.

In step 502 effect of the current remediation on the speech intelligibility test signal for the selected region is determined, in whole or in part by unit 20 and sensor nodes 22-*i*, 30-*i*. Unit 20 communicates the appropriate remediation information to all sensor nodes 22-*i*, 30-*i* in the selected region in step 504.

A revised test signal for the selected speech intelligibility method is generated by unit 20, and presented to the voice output units 12-*i*, 14-*i* via the wired/wireless media 16, 18 for the selected region in step 508.

The sensor nodes 22-*i*, 30-*i* in the selected region detect and process the audio signal resulting from the effects of the voice output units 12-*i*, 14-*i* in the selected region on the remediated test signal in step 510.

In step 512, sensor nodes 22-*i*, 30-*i* then compute the selected quantitative speech intelligibility, adjusted for the remediation applied to the test signal, and communicate results to unit 20 in step 514. Some or all of step 512 may be performed by the unit 20.

The revised speech intelligibility score is determined in step 516, in whole or in part by unit 20 and sensor nodes 22-*i*, 30-*i*.

It will be understood that the processing of method 500, in implementing 104 of FIG. 5A can be carried out at some or all of the sensor modules 22-*i*, 30-*i* in response to incoming audio from system 20 or other audio input source without departing from the spirit or scope of the present invention. Further, that processing can also be carried out in alternate embodiments at monitoring unit 20.

It will also be understood by those skilled in the art that the space depicted may vary for different regions selected for possible remediation. It will also be understood that process 500 can be initiated and carried out automatically substantially without any human intervention.

In summary, as a result of carrying out the processes of FIGS. 5A, B and 6 the intelligibility of speech announcements from the output units 12-*i* or speakers 14-*i*, for example, should be improved. In addition, or alternately, information as to the how the speech output is to be shaped to improve intelligibility can be provided to an operator, at the system 20, either graphically or in tabular form on a display or as hard copy.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed:

1. A method comprising:

determining if a selected test score should be established based on current remediation parameters applied to a plurality of voice output devices distributed throughout a region, and responsive thereto, establishing the test score;

responding to the test score, sensing the ambient sound in the region through a plurality of microphones distributed throughout the region for a predetermined time interval;

analyzing the sensed ambient sound;

overlaying the ambient sound in the region with a plurality of test audio signals injected into the region having predetermined characteristics;

sensing the overlaid ambient sound via the plurality of microphones;

determining if speech intelligibility in the region has been degraded beyond an acceptable standard;

upon detecting that the speech intelligibility has degraded beyond the acceptable standard based upon maximum attainable remediation values for at least one of frequency band energy and sound pressure level, automatically optimizing the current remediation parameters applied to a sound source operating within the region by adjusting at least some of pace, pitch, frequency spectra and sound pressure level of audio from at least some of the plurality of voice output devices.

2. A method as in claim 1 where the determining includes analyzing the ambient sound pressure level.

3. A method as in claim 1 where the determining includes analyzing the ambient frequency domain characteristics.

4. A method as in claim 1 which includes overlaying the ambient sound with modulated noise.

5. A method as in claim 4 which includes amplitude modulating the noise.

6. A method as in claim 5 which includes providing amplitude modulated noise for a predetermined time interval.

7. A method as in claim 5 which includes providing amplitude modulated noise of a predetermined periodicity.

8. A method as in claim 7 which includes providing amplitude modulated noise for a predetermined time interval.

9. A method as in claim 7 where the amplitude modulation exceeds fifty percent of signal amplitude.

10. A method as in claim 7 where the amplitude modulation exceeds ninety percent of signal amplitude.

11. A method as in claim 7 where the determining includes analyzing the maximum attainable sound pressure level.

12. A method as in claim 10 where the determining includes analyzing trailing edge characteristics of received audio test signals to measure decay time in the region.

13. A method as in claim 7 where the overlaid test signals are emitted with a predetermined maximum attainable sound pressure level.

14. A method as in claim 7 where the overlaid test signals are emitted with at least a predetermined minimum frequency bandwidth.

15. A method for remediation comprising:

providing a plurality of voice output devices and a plurality of microphones in a region;

determining if remediation is feasible within the region using a dynamically modifiable selected test score based upon a maximum attainable value of at least one of frequency spectra and sound pressure level measured within the region by the plurality of microphones in response to test signals injected into the region, and responsive thereto determining optimum remediation for each of the plurality of voice output devices distributed throughout and producing sound within the region;

determining current remediation for each of the plurality of voice output devices;

comparing current and optimum remediation for each of the plurality of voice output devices;

determining if current and optimum remediation differ, and if so, automatically carrying out at least a determined optimum amplitude remediation in at least some of the plurality of voice output devices by adjusting at least some of pace, pitch, frequency spectra and sound pressure level from at least some of the plurality of voice output devices.

16. A method as in claim 15 which includes carrying out optimum frequency bands energy remediation.

17. A method as in claim 15 which includes carrying out optimum pace remediation.

18. A method as in claim 15 which includes carrying out optimum pitch remediation.

19. A method as in claim 15 which includes carrying out optimum amplitude of the speech message remediation.

20. A method as in claim 15 which includes varying the rate of speech message.

21. A method as in claim 15 which includes varying the pitch of a speech message.

22. A method as in claim 15 which includes varying the frequency bands energy of a speech message.

23. A method as in claim 15 which includes varying the amplitude of a speech message.

24. A method as in claim 1 where establishing the test score includes generating a revised test signal in accordance with current remediation parameters and using that signal in establishing the test score.

25. A method as in claim 1 where establishing the test score includes modifying one or more of the parameters involved in determining the test score in accordance with current remediation parameters.

* * * * *